(12) United States Patent
Moriwaki et al.

(10) Patent No.: US 6,509,225 B2
(45) Date of Patent: *Jan. 21, 2003

(54) SEMICONDUCTOR DEVICE AND METHOD OF MANUFACTURING THE SAME

(75) Inventors: Masaru Moriwaki, Osaka (JP); Takayuki Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/931,719

(22) Filed: Aug. 20, 2001

(65) Prior Publication Data

US 2002/0004270 A1 Jan. 10, 2002

Related U.S. Application Data

(62) Division of application No. 09/433,221, filed on Nov. 4, 1999.

(30) Foreign Application Priority Data

Dec. 25, 1998 (JP) ............................. 10-370113

(51) Int. Cl.[7] ......................................... H01L 21/8242
(52) U.S. Cl. ....................................... 438/241; 438/296
(58) Field of Search ................................. 438/197, 238, 438/239, 241, 256, 258, 296, 393, 399, 394

(56) References Cited

U.S. PATENT DOCUMENTS

| 5,960,270 | A | 9/1999 | Misra et al. | 438/197 |
| 6,054,355 | A | 4/2000 | Inumiya et al. | 438/296 |
| 6,184,093 | B1 | 2/2001 | Tsunashima et al. | 438/275 |
| 6,228,714 | B1 | 5/2001 | Choi | 438/258 |
| 6,333,223 | B1 * | 12/2001 | Moriwaki et al. | |

FOREIGN PATENT DOCUMENTS

| JP | 03-046267 | 2/1991 |
| JP | 04-162771 | 6/1992 |
| JP | 08-107154 | 4/1996 |
| JP | 09-148449 | 6/1997 |
| JP | 09-232443 | 9/1997 |
| JP | 09-293862 | 11/1997 |
| JP | 10-189966 | 7/1998 |
| JP | 11-074368 | 3/1999 |
| JP | 11-126829 | 5/1999 |

OTHER PUBLICATIONS

A. Chatterjee, et al., "CMOS Metal Replacement Gate Transistors Using Tantalum Pentoxide Gate Insulator", p, 777, 1998.

Atsushi Yagishita et al., "High Performance Metal Gate MOSFETs Fabricated by CMP for 0.1um Regime" p. 785, 1998.

* cited by examiner

Primary Examiner—David Nelms
Assistant Examiner—Phuc T. Dang
(74) Attorney, Agent, or Firm—Nixon Peabody LLP; Donald R. Studebaker

(57) ABSTRACT

A semiconductor device comprises a first MOSFET and a second MOSFET. The first MOSFET includes a first gate insulating film formed on a semiconductor substrate and having a relatively large thickness and a first gate electrode composed of a polysilicon film formed on the first gate insulating film. The second MOSFET includes a second gate insulating film formed on the semiconductor substrate and having a relatively small thickness and a second gate electrode composed of a metal film made of a refractory metal or a compound of a refractory metal and formed on the second gate insulating film.

4 Claims, 11 Drawing Sheets

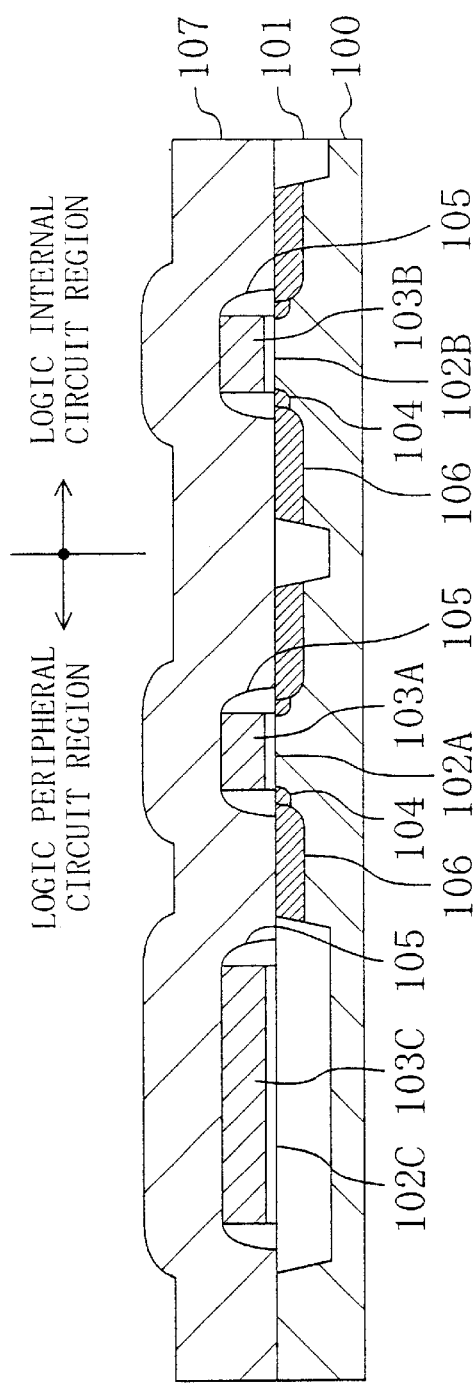
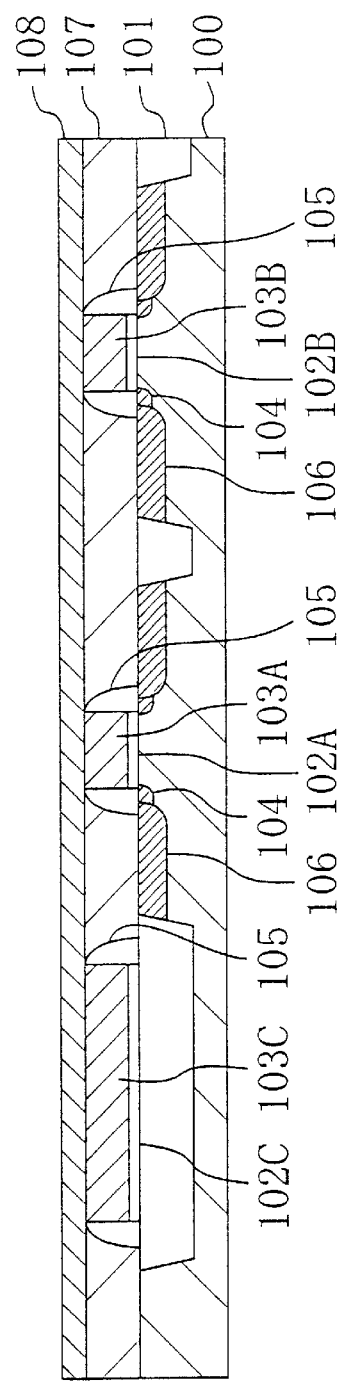
Fig. 1(a)
Fig. 1(b)

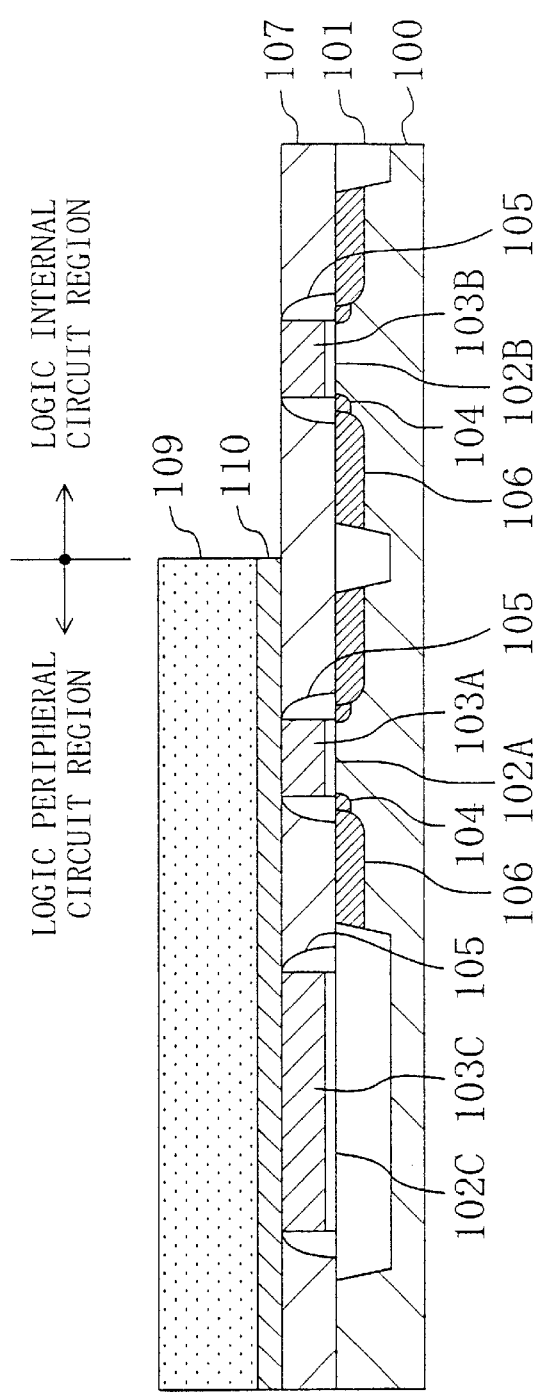
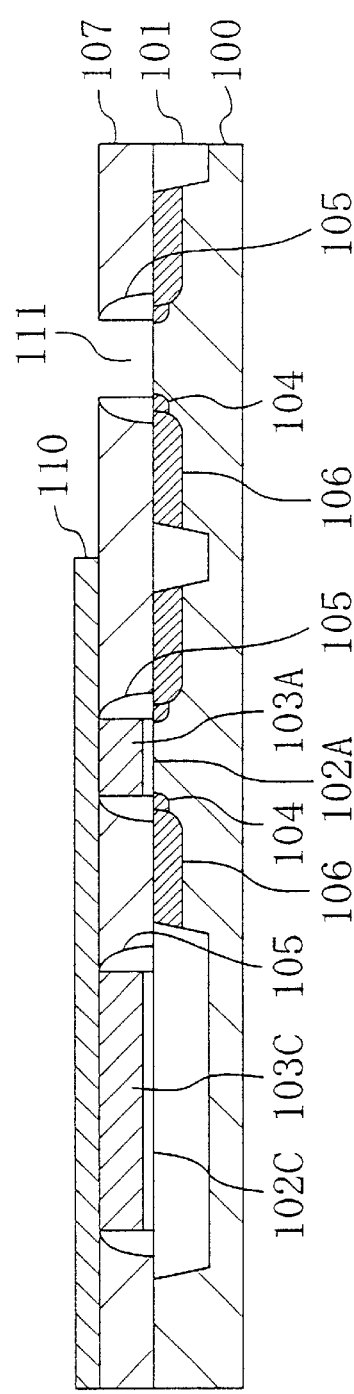
Fig. 2(a)
Fig. 2(b)

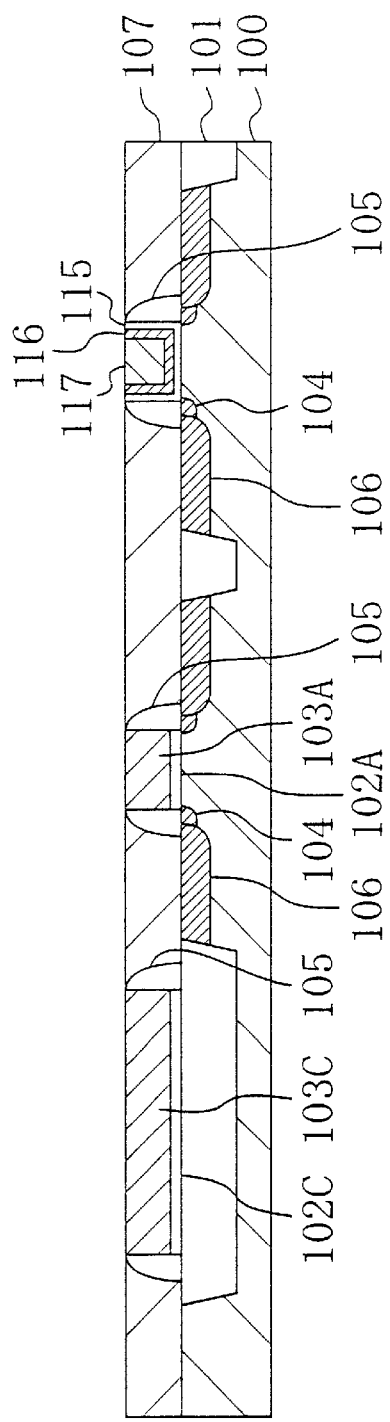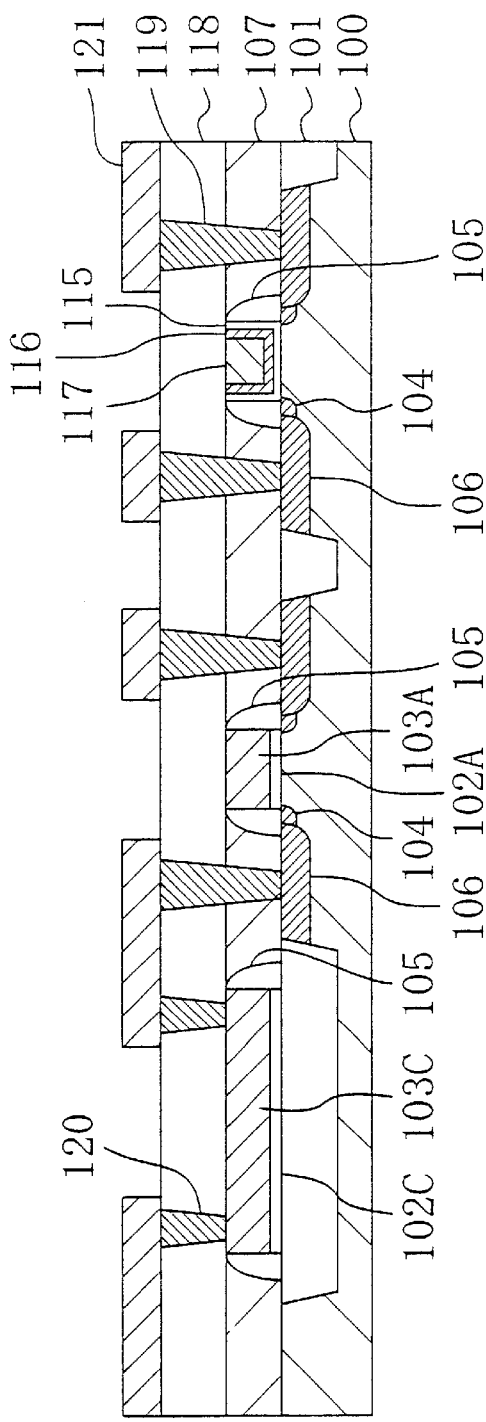
Fig. 3(a)
Fig. 3(b)

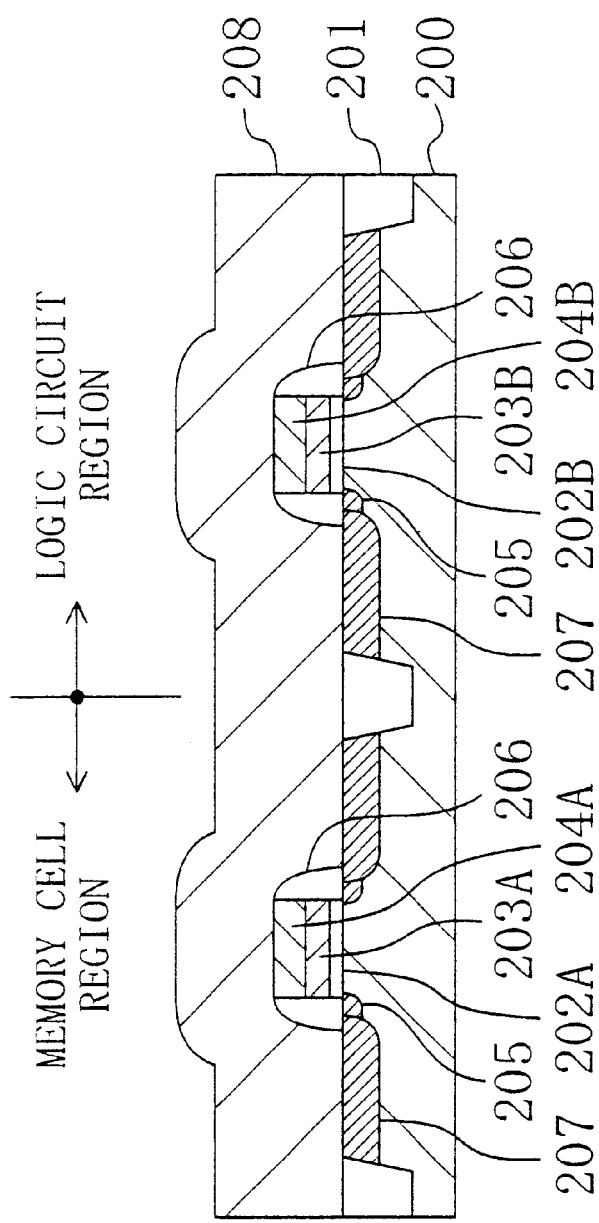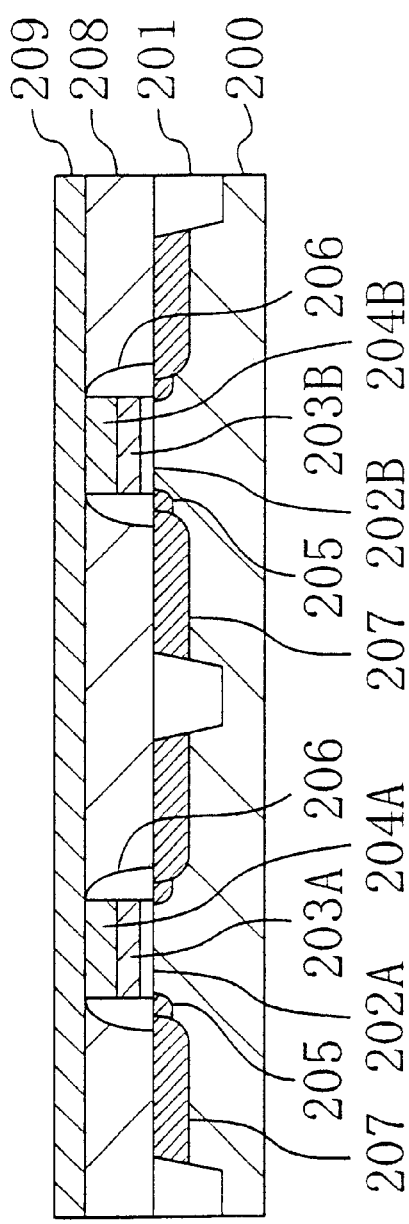
Fig. 4(a)
Fig. 4(b)

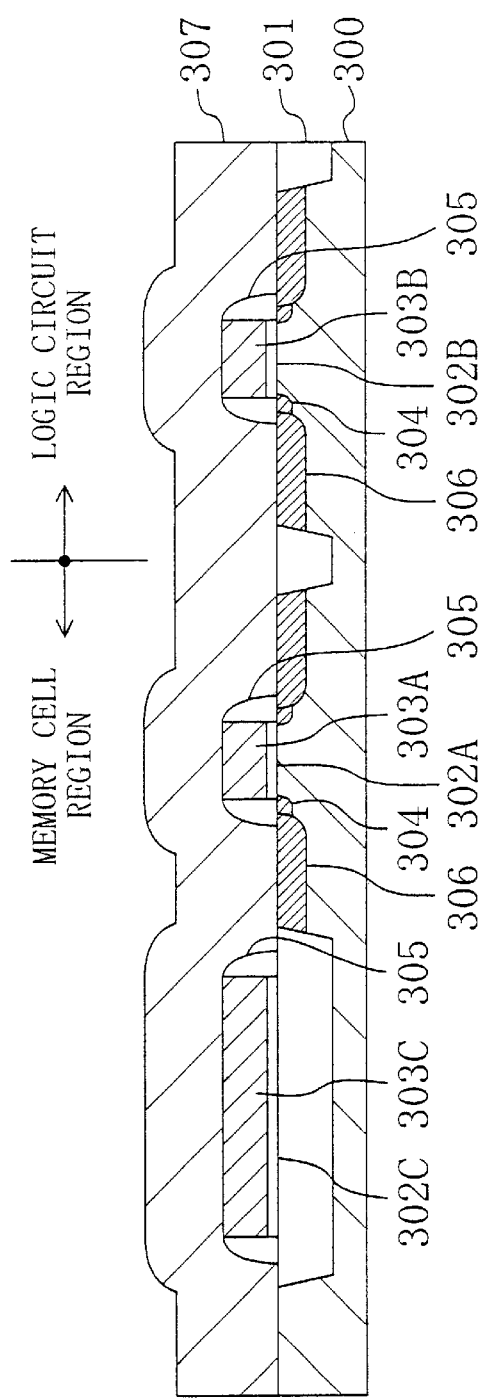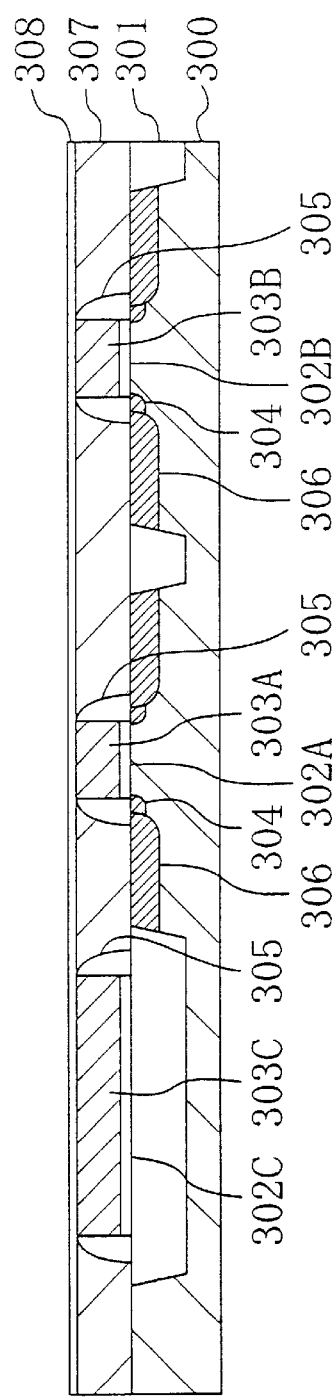
Fig. 7(a)
Fig. 7(b)

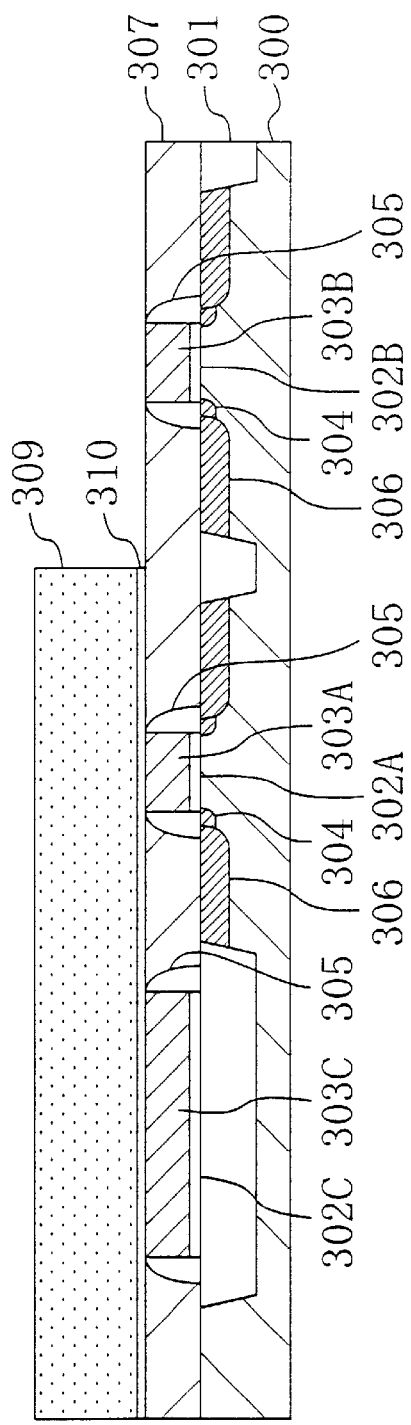
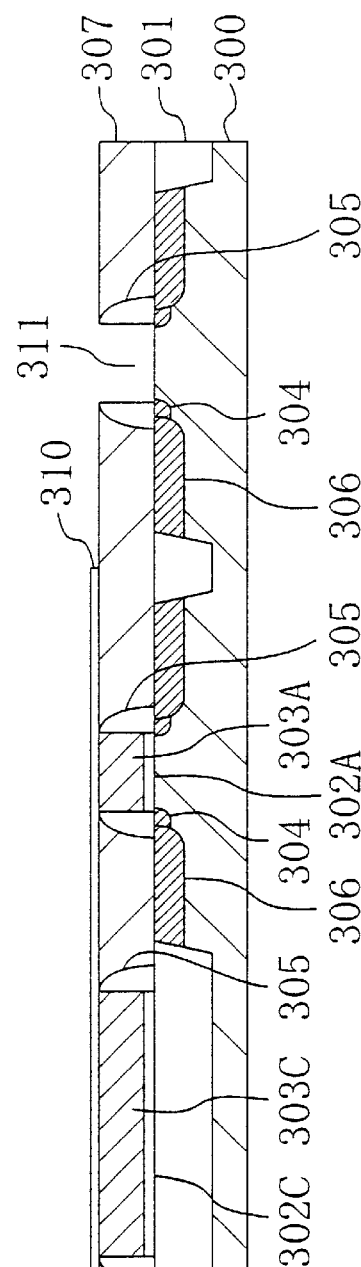
Fig. 8(a)
Fig. 8(b)

LOGIC INTERNAL CIRCUIT REGION ←→ LOGIC PERIPHERAL CIRCUIT REGION
Fig. 10 (a) Prior Art
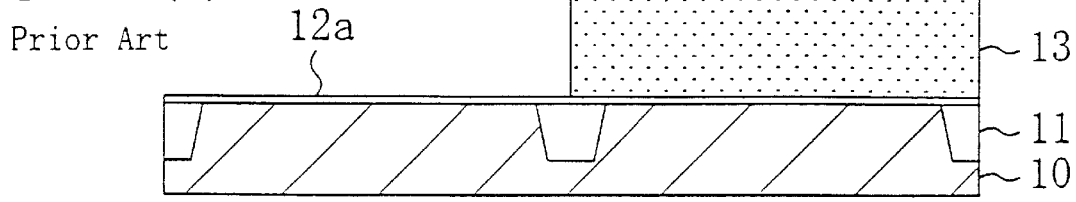
Fig. 10 (b) Prior Art
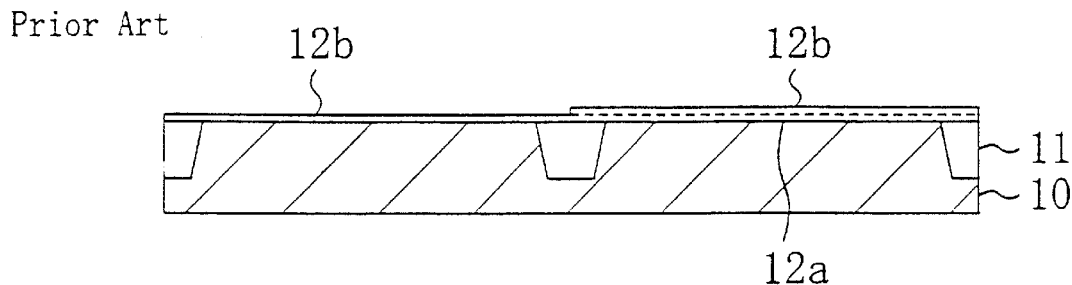
Fig. 10(c) Prior Art
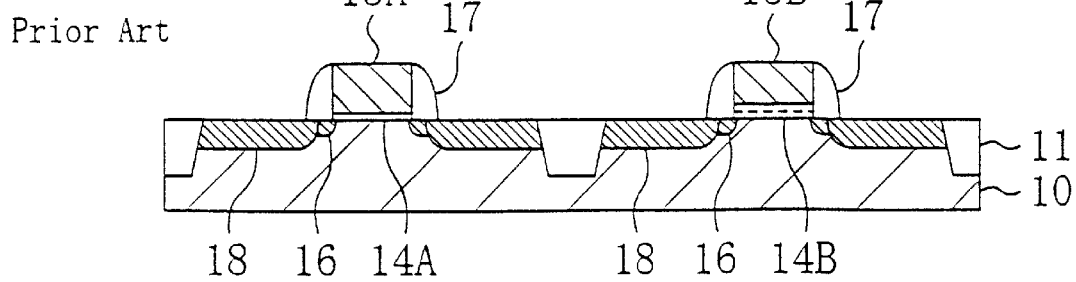

SEMICONDUCTOR DEVICE AND METHOD OF MANUFACTURING THE SAME

This application is a division of application Ser. No. 09/433,221, filed Nov. 4, 1999.

BACKGROUND OF THE INVENTION

The present invention relates to a semiconductor device comprising MOSFETs having respective gate insulating films with different thicknesses and to a method of manufacturing the same.

As higher-speed operations have been achieved in recent semiconductor integrated circuit devices, the thickness of the gate insulating film of a MOSFET has been reduced increasingly.

On the other hand, a lower driving voltage has been pursued for a logic circuit in a semiconductor integrated circuit with the view to lowering the power consumption of the semiconductor integrated circuit device. In the peripheral circuit of the logic circuit for performing input/output operations, however, it is necessary to drive a MOSFET with a voltage inputted from the outside. To hold its breakdown voltage high, therefore, a transistor provided in the peripheral circuit of the logic circuit uses a gate insulating film having a larger thickness than a transistor provided in the internal circuit of the logic circuit.

A description will be given to a method of manufacturing MOSFETs having respective gate insulating films with different thicknesses.

First, as shown in FIG. 10(a), isolation region 11 are formed in a semiconductor substrate 10 made of silicon, followed by a first silicon oxide film 12a with a thickness of, e.g., 4 nm formed over the entire surface of the semiconductor substrate 10 to serve as a gate insulating film. Thereafter, a resist pattern 13 is formed on the portion of the first silicon oxide film 12a corresponding to the peripheral circuit region of a logic circuit. Wet etching is then performed by using, e.g., hydrofluoric acid with respect to the first silicon oxide film 12a, thereby selectively removing the portion of the first silicon oxide film 12a corresponding to the internal circuit region of the logic circuit.

Next, as shown in FIG. 10(b), a second silicon oxide film 12b with a thickness of, e.g., 3 nm is formed over the entire surface of the semiconductor substrate 10.

Next, as shown in FIG. 10(c), a first gate insulating film 14A composed of the second silicon oxide film 12b and a first gate electrode 15A composed of a polysilicon film are formed in the internal circuit region of the logic circuit, while a second gate insulating film 14B composed of the first and second silicon oxide films 12a and 12b and a second gate electrode 15B composed of the polysilicon film are formed in the peripheral circuit region of the logic circuit.

Next, an impurity is implanted by using the first and second gate electrodes 15A and 15B as a mask to form lightly doped regions 16. Then, sidewalls 17 are formed on each of the first and second gate electrodes 15A and 15B. After that, an impurity is implanted by using, as a mask, the first and second gate electrodes 15A and 15B and the sidewalls to form heavily doped regions 18.

As a result, a first MOSFET including the first gate insulating film 14A composed of the second silicon oxide film 12b and having a thickness of 3 nm is obtained in the internal circuit region of the logic circuit, while a second MOSFET including the second gate insulating film 14B composed of the first and second silicon oxide films 12a and 12b and having a thickness of 7 nm is obtained in the peripheral circuit region of the logic circuit.

In accordance with the conventional method of manufacturing a semiconductor device, however, the second gate insulating film 14B obtained in the peripheral circuit of the logic circuit is formed in two separate steps, so that it is difficult for the second gate insulating film 14B to have a lifespan which is as long as the lifespan of a gate oxide film obtained in one oxidation step. This is because the second silicon oxide film 12b composing the second gate insulating film 14B is formed on the first silicon oxide film 12a after the resist pattern 13 is removed. Since the surface of the first silicon oxide film 12a has been contaminated or damaged in the step of removing the resist pattern 13, the reliability of the gate insulating film 14B is degraded.

SUMMARY OF THE INVENTION

In view of the foregoing, it is therefore an object of the present invention to improve the reliability of each of first and second gate insulating films having different thicknesses.

A first semiconductor device according to the present invention comprises a first MOSFET and a second MOSFET, the first MOSFET including: a first gate insulating film formed on a semiconductor substrate and having a relatively large thickness; and a first gate electrode composed of a polysilicon film formed on the first gate insulating film, the second MOSFET including: a second gate insulating film formed on the semiconductor substrate and having a relatively small thickness; and a second gate electrode composed of a metal film made of a refractory metal or a compound of a refractory metal and formed on the second gate insulating film.

In the first semiconductor device, the first gate insulating film of the first MOSFET has a relatively large thickness. Accordingly, the first MOSFET can be driven with a high voltage.

On the other hand, the second gate insulating film of the second MOSFET has a relatively small thickness. Accordingly, the second MOSFET can be driven with a low voltage so that power consumption is reduced. Since the second gate electrode is composed of the metal film made of a refractory metal or a compound of a refractory metal, the depletion of the second gate electrode can be prevented and the performance of the second MOSFET is improved.

With the first semiconductor device, therefore, the first MOSFET can be driven with a high voltage, while the second MOSFET can be driven with a low voltage and the depletion of the second gate electrode at the interface between itself and the gate insulating film is prevented. This increases the performance of the gate electrode and allows the formation of the two MOSFETs, of which different performances are required, on a single semiconductor substrate with high reliability.

In the first semiconductor device, the first MOSFET is preferably formed in a region of the semiconductor substrate corresponding to a peripheral circuit region of a logic circuit and the second MOSFET is preferably formed in a region of the semiconductor substrate corresponding to an internal circuit region of the logic circuit.

The arrangement enables driving with a high voltage which is required in the peripheral circuit of the logic circuit as well as driving with a low voltage which is required in the internal circuit of the logic circuit, while increasing the performance of the transistors.

In the first semiconductor device, the first MOSFET is preferably formed in a memory cell region of the semiconductor substrate and the second MOSFET is preferably formed in a logic circuit region of the semiconductor substrate.

The arrangement prevents a reduction in pause time (charge retention time of one memory cell) resulting from a leakage current, which is required in the memory cell, while increasing the performance of the MOSFETs, which is required in the logic circuit.

Preferably, the first semiconductor device further comprises a resistor composed of a polysilicon film formed in the step of forming the polysilicon film composing the first gate electrode. In the arrangement, a resistor can be provided without increasing the number of process steps.

In the first semiconductor device, the first gate insulating film is preferably composed of a silicon oxide film and the second gate insulating film is preferably composed of a silicon oxynitride film.

This further reduces the thickness of the second gate insulating film and increases the reliability thereof, thereby increasing the performance of the second MOSFET.

A second semiconductor device according to the present invention comprises a first MOSFET and a second MOSFET, the first MOSFET including: a first gate insulating film formed on a semiconductor substrate and having a relatively large thickness; and a first gate electrode composed of a multilayer structure formed on the first gate insulating film, the multilayer structure being composed of a lower-layer polysilicon film and an upper-layer metal film made of a refractory metal or a compound of a refractory metal, the second MOSFET including: a second gate insulating film formed on the semiconductor substrate and having a relatively small thickness; and a second gate electrode composed of a metal film made of a refractory metal or a compound of a refractory metal and formed on the second gate insulating film.

In the second semiconductor device, the first gate insulating film of the first MOSFET has a relatively large thickness and the first gate electrode is composed of the multilayer structure consisting of the polysilicon film and the metal film. Accordingly, the gate electrode can be reduced in resistance and increased in breakdown voltage.

Since the second gate insulating film of the second MOSFET has a relatively small thickness, it can be driven with a low voltage so that power consumption is reduced. Since the second gate electrode is composed of the metal film made of a refractory metal or a compound of a refractory metal, the depletion of the second gate electrode can be prevented and the performance of the second MOSFET is improved.

With the second semiconductor device, therefore, the gate electrode of the first MOSFET can be reduced in resistance and increased in breakdown voltage, while the second MOSFET can be driven with a low voltage and the depletion of the second gate electrode at the interface between itself and the gate insulating film is prevented. This increases the performance of the gate electrode and allows the formation of the two MOSFETs, of which different performances are required, on a single semiconductor substrate with high reliability.

In the second semiconductor device, the first MOSFET is preferably formed in a memory cell region of the semiconductor substrate and the second MOSFET is preferably formed in a logic circuit region of the semiconductor substrate.

In the arrangement, the gate electrode can be reduced in resistance and increased in breakdown voltage in the memory cell region, while the transistor can be increased in performance in the logic circuit.

A first method of manufacturing a semiconductor device according to the present invention comprises: a first film forming step of successively forming, on a semiconductor substrate, a first insulating film having a relatively large thickness and a polysilicon film; a patterning step of patterning the polysilicon film and the first insulating film to form a first gate insulating film of a first MOSFET and a dummy gate insulating film, each being composed of the first insulating film, and to form a first gate electrode of the first MOSFET and a dummy gate electrode, each being composed of the polysilicon film; a sidewall forming step of forming sidewalls on each of the first gate electrode and the dummy gate electrode; an insulating film removing step of depositing an interlayer insulating film over the entire surface of the semiconductor substrate, removing the portions of the interlayer insulating film overlying the first gate electrode and the dummy gate electrode, and thereby exposing the first gate electrode and the dummy gate electrode; an etching step of forming, on the interlayer insulating film, a mask pattern covering the first gate electrode and exposing the dummy gate electrode, performing etching by using the mask pattern to remove the dummy gate electrode and the dummy gate insulating film, and thereby forming a depressed portion internally of the sidewalls of the dummy gate electrode; a second film forming step of successively forming, over the entire surface of the semiconductor substrate, a second insulating film having a relative small thickness and a metal film made of a refractory metal or a compound of a refractory metal such that the depressed portion is filled therewith; and a film removing step of removing the mask pattern and the portions of the second insulating film and the metal film located externally of the depressed portion and thereby forming a second gate insulating film of a second MOSFET composed of the second insulating film and a second gate electrode of the second MOSFET composed of the metal film.

In accordance with the first method of manufacturing a semiconductor device, the polysilicon film and the first insulating film having a relatively large thickness are patterned to form the first gate insulating film of the first MOSFET composed of the first insulating film and the first gate electrode of the first MOSFET composed of the polysilicon film. Accordingly, there can be formed the first MOSFET having the first gate insulating film with a relatively large thickness and the second gate electrode composed of the polysilicon film.

On the other hand, the second insulating film having a relatively small thickness and the metal film are filled in the depressed portion formed as a result of removing the dummy gate electrode and the dummy gate insulating film to form the second gate insulating film of the second MOSFET composed of the second insulating film and the second gate electrode of the second MOSFET composed of the metal film. Accordingly, there can be formed the second MOSFET having the second insulating film with a relatively small thickness and the second gate electrode composed of the metal film.

In accordance with the first method of manufacturing a semiconductor device, therefore, the first MOSFET having the first gate insulating film with a relatively large thickness, the first gate electrode composed of the polysilicon film, the second MOSFET having the second gate insulating film with a relatively small thickness, and the second gate electrode composed of the metal film can be formed on a single semiconductor substrate. This ensures the formation of the two MOSFETs, of which different performances are required, on a single semiconductor substrate with high reliability.

Since the first gate insulating film of the first MOSFET is formed by patterning the first insulating film formed in one step, the reliability thereof is improved compared with a conventional gate insulating film formed in two steps.

In the first method of manufacturing a semiconductor device, the patterning step preferably includes the step of forming the first gate insulating film and the first gate electrode on a region of the semiconductor substrate corresponding to a peripheral circuit region of a logic circuit and forming the dummy insulating film and the dummy gate electrode on a region of the semiconductor substrate corresponding to an internal circuit region of the logic circuit.

This allows the formation the first MOSFET which can be driven with a high voltage in the peripheral circuit of the logic circuit and the formation of the higher-performance second MOSFET which can be driven with a low voltage in the internal circuit of the logic circuit.

In the first method of manufacturing a semiconductor device, the patterning step preferably includes the step of forming the first gate insulating film and the first gate electrode on a memory cell region of the semiconductor substrate and forming the dummy insulating film and the dummy gate electrode on a logic circuit region of the semiconductor substrate.

In the arrangement, the first MOSFET capable of preventing a reduction in pause time resulting from a leakage current can be formed in the memory cell region and the high-performance second MOSFET can be formed in the logic circuit.

In the first method of manufacturing a semiconductor device, the patterning step preferably includes the step of patterning the polysilicon film and the first insulating film to form a resistor insulating film composed of the first insulating film and a resistor composed of the polysilicon film.

This allows the formation of a resistor without increasing the number of process steps.

In the first method of manufacturing a semiconductor device, the first film forming step preferably includes the step of forming a silicon oxide film as the first insulating film and the second film forming step preferably includes the step of forming a silicon oxynitride film as the second insulating film.

This further reduces the thickness of the second insulating film and increases the reliability thereof, thereby further increasing the performance of the second MOSFET.

In the first method of manufacturing a semiconductor device, the etching step preferably includes the step of removing the dummy gate electrode and the dummy gate insulating film by wet etching.

This prevents the region of the semiconductor substrate, which is to serve as the channel, from being damaged.

A second method of manufacturing a semiconductor device according to the present invention comprises: a first film forming step of successively forming, on a semiconductor substrate, a first insulating film having a relatively large thickness and a polysilicon film; a first patterning step of patterning the polysilicon film and the first insulating film to form a first-layer gate insulating film of a flash memory and a dummy gate insulating film, each being composed of the first insulating film, and to form a floating gate electrode of the flash memory and a dummy gate electrode, each being composed of the polysilicon film; a sidewall forming step of forming sidewalls on each of the floating gate electrode and the dummy gate electrode; an insulating film removing step of depositing an interlayer insulating film over the entire surface of the semiconductor substrate, removing the portions of the interlayer insulating film overlying the floating gate electrode and the dummy gate electrode, and thereby exposing the floating gate electrode and the dummy gate electrode; an etching step of forming, on the interlayer insulating film, a second insulating film covering the floating gate electrode and exposing the dummy gate electrode, performing etching by using the insulating film to remove the dummy gate electrode and the dummy gate insulating film, and thereby forming a depressed portion internally of the sidewalls of the dummy gate electrode; a second film forming step of successively forming, over the entire surface of the semiconductor substrate, a third insulating film having a relatively small thickness and a metal film made of a refractory metal or a compound of a refractory metal such that the depressed portion is filled therewith; and a second patterning step of patterning the second insulating film, the third insulating film, and the metal film to form a second-layer gate insulating film of the flash memory composed of the second and third insulating films, a gate insulating film of a MOSFET composed of the third insulating film, a control electrode of the flash memory composed of the metal film, and a gate electrode of the MOSFET composed of the metal film.

In accordance with the second method of manufacturing a semiconductor device, the first insulating film having a relatively large thickness is patterned in the first patterning step to form the first-layer gate insulating film of the flash memory and the second and third insulating films are patterned in the second patterning step to form the second-layer gate insulating film of the flash memory. Briefly, the first-layer and second-layer gate insulating films have sufficiently large thicknesses, so that the reliability of the flash memory is improved.

On the other hand, the third insulating film with a relatively small thickness and the metal film are filled in the depressed portion formed as a result of removing the dummy gate electrode and the dummy gate insulating film to form the insulating film of the MOSFET composed of the third insulating film and the gate electrode of the MOSFET composed of the metal film. Accordingly, there can be formed the MOSFET having the gate insulating film with a relatively small thickness and the gate electrode composed of the metal film.

Since the second method of manufacturing a semiconductor device allows the formation of the flash memory having the first-layer gate insulating film with a large thickness and the second-layer gate insulating film composed of the multilayer structure consisting of the second and third insulating films, the reliability of the flash memory is improved.

Since the second method of manufacturing a semiconductor device also allows the formation of the MOSFET having the gate insulating film with a relatively small thickness and the gate electrode composed of the metal film, the performance of the MOSFET can be improved. Since the gate insulating film of the MOSFET is formed by patterning the first insulating film formed in one step, the reliability thereof is improved compared with a conventional gate insulating film formed in two steps.

In the second method of manufacturing a semiconductor device, the etching step preferably includes the step of removing the dummy gate electrode and the dummy gate insulating film by wet etching.

This prevents the region of the semiconductor substrate, which is to serve as the channel, from being damaged.

In the second method of manufacturing a semiconductor device, the first patterning step preferably includes the step of patterning the polysilicon film and the first insulating film to form a capacitor insulating film composed of the first insulating film and a capacitor lower electrode composed of the polysilicon film and the second patterning step preferably includes the step of patterning the second insulating film, the third insulating film, and the metal film to form a capacitor insulating film composed of the second and third insulating films and a capacitor upper electrode composed of the metal film.

This allows the formation of a capacitor with high reliability without increasing the number of process steps.

BRIEF DESCRIPTION OF THE DRAWINGS

FIGS. 1(a) and 1(b) cross-sectional views illustrating the individual process steps of a method of manufacturing a semiconductor device according to a first embodiment of the present invention;

FIGS. 2(a) to 2(c) are cross-sectional views illustrating the individual process steps of the method of manufacturing a semiconductor device according to the first embodiment;

FIGS. 3(a) and 3(b) are cross-sectional views illustrating the individual process steps of the method of manufacturing a semiconductor device according to the first embodiment;

FIGS. 4(a) and 4(b) are cross-sectional views illustrating the individual process steps of a method of manufacturing a semiconductor device according to a second embodiment of the present invention;

FIGS. 7(a) and 7(b) are cross-sectional views illustrating the individual process steps of a method of manufacturing a semiconductor device according to a third embodiment of the present invention;

FIGS. 8(a) and 8(b) are cross-sectional views illustrating the individual process steps of the method of manufacturing a semiconductor device according to the third embodiment;

FIGS. 10(a) to 10(c) are cross-sectional views illustrating the individual process steps of a conventional method of manufacturing a semiconductor device.

DETAILED DESCRIPTION OF THE INVENTION

EMBODIMENT 1

Figure 2C:
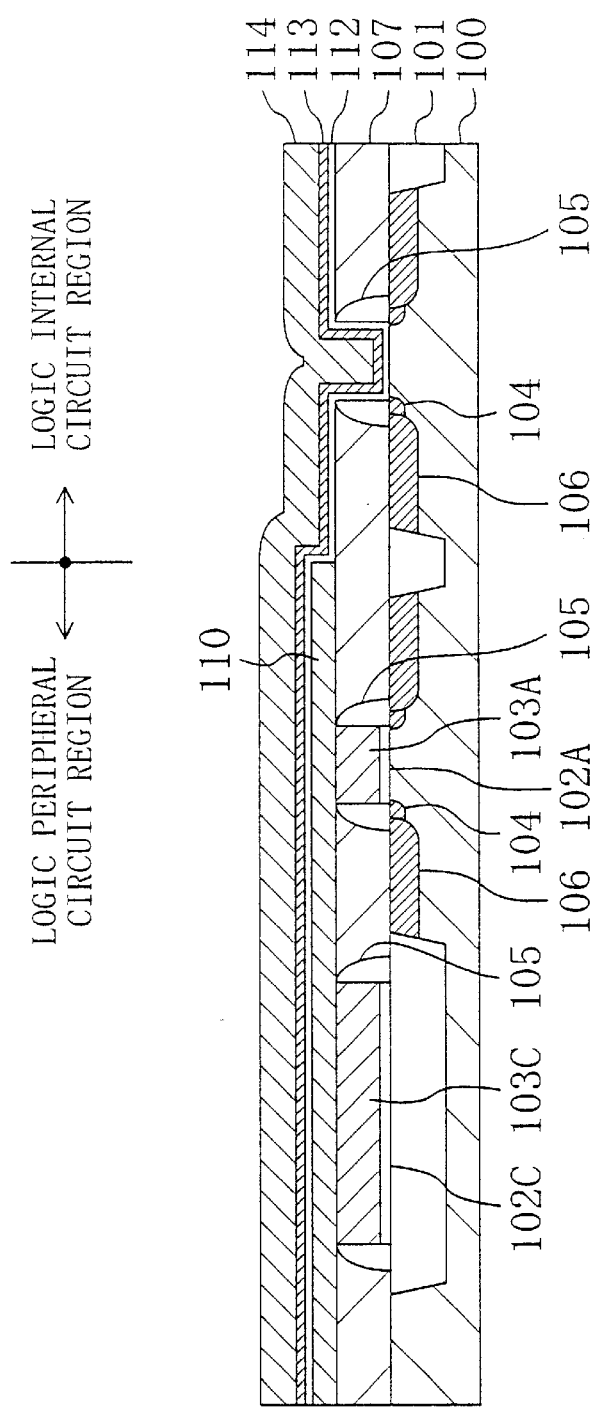

As a method of manufacturing a semiconductor device according to a first embodiment of the present invention, there will be described a method of forming a first MOSFET and a resistor in a logic peripheral circuit region for performing input/output operations in a logic circuit and forming a second MOSFET in a logic internal circuit region for performing arithmetic operations in the logic circuit with reference to FIGS. 1(a) and 1(b), 2(a), 2(b) and 2(c), and 3(a) and 3(b).

First, as shown in FIG. 1(a), isolation regions 101 are formed in a surface region of a semiconductor substrate 100 made of silicon. Subsequently, a first silicon oxide film having a thickness of, e.g., 7 nm and a polysilicon film having a thickness of, e.g., 120 nm and doped with an impurity are formed successively over the entire surface of the semiconductor substrate 100. Then, the polysilicon film and the first silicon oxide film are patterned successively to form a first gate insulating film 102A composed of the first silicon oxide film and a first gate electrode 103A composed of the polysilicon film in the MOSFET formation area of the logic peripheral circuit region, to form a dummy gate insulating film 102B composed of the first silicon oxide film and a dummy gate electrode 103B composed of the polysilicon film in the logic internal circuit region, and to form a resistor insulating film 102C composed of the first silicon oxide film and a resistor 103C composed of the polysilicon film in the resistor formation area of the logic peripheral circuit region.

Next, an impurity is implanted by using the first gate electrode 103A and the dummy gate electrode 103B as a mask to form lightly doped regions 104. Thereafter, sidewalls 105 are formed on each of the first gate electrode 103A, the dummy gate electrode 103B, and the resistor 103C. Then, an impurity is implanted by using the first gate electrode 103A, the dummy gate electrode 103B, and the sidewalls 105 as a mask to form heavily doped regions 106 which are to serve as a source and a drain. After that, a first interlayer insulating film 107 composed of a silicon oxide film with a thickness of, e.g., 400 nm is deposited by, e.g., chemical vapor deposition (CVD) over the entire surface of the semiconductor substrate 100.

Next, as shown in FIG. 1(b), the first interlayer insulating film 107 is planarized by, e.g., chemical mechanical polishing (CMP) and the respective top surfaces of the first gate electrode 103A, the dummy gate electrode 103B, and the resistor 103C are exposed. Thereafter, a silicon nitride film 108 with a thickness of, e.g., 50 nm is deposited over the entire surface of the semiconductor substrate 100.

Next, as shown in FIG. 2(a), a resist pattern 109 covering a logic peripheral circuit is formed on the silicon nitride film 108. Subsequently, etching is performed with respect to the silicon nitride film 108 masked with the resist pattern 109 to form a mask pattern 110 composed of the silicon nitride film 108.

Next, as shown in FIG. 2(b), after removing the resist pattern 109, the dummy gate electrode 103B is removed by wet etching using an etchant solution composed of an alkaline solution such as KOH. Thereafter, the dummy gate insulating film 102B is removed by wet etching using an etchant solution composed of a HF solution, whereby a depressed portion 111 is formed internally of the sidewalls 105 in the logic internal circuit region.

Next, as shown in FIG. 2(c), a second silicon oxide film 112 with a thickness of, e.g., 3 nm is formed over the entire surface of the semiconductor substrate 100. Then, a first metal film 113 made of a compound of a refractory metal such as tungsten nitride and having a thickness of about 10 nm is deposited by, e.g., CVD over the entire surface of the second silicon oxide film 112. Thereafter, a second metal film 114 made of, e.g., tungsten and having a thickness of about 120 nm is deposited by, e.g., CVD over the entire surface of the first metal film 113.

Next, as shown in FIG. 3(a), a planarization step is performed with respect to the second metal film 114, the first metal film 113, and the mask pattern 110 by, e.g., CMP, thereby forming a second gate insulating film 115 composed of the second silicon oxide film 112, a barrier metal 116 composed of the first metal film 113, and a second gate electrode 117 composed of the second metal film 114 in the depressed portion 111 internal of the sidewalls 105. Preferably, a slurry with little selectivity between the first and second metal films 113 and 114 and the mask pattern 110 (silicon nitride film 108) is used in the planarization step.

Next, as shown in FIG. 3(b), a second interlayer insulating film 118 composed of a silicon oxide film is deposited over the entire surface of the semiconductor substrate 100 and then planarized by, e.g., CMP. Next, first contacts 119 connected to the heavily doped region 106 are formed through the second interlayer insulating film 118,while second contacts 120 connected to the resistor 103C are formed. Thereafter, a metal wire 121 connected to the first and second contacts 119 and 120 is formed, whereby the first MOSFET and resistor are formed in the logic peripheral circuit region and a second MOSFET is formed in the logic internal circuit region.

According to the first embodiment, the first MOSFET having the first gate insulating film 102A composed of the first silicon oxide film with a thickness of 7 nm is formed in one step in the logic peripheral circuit region, while the second MOSFET having the second gate insulating film 115 composed of the second silicon oxide film 112 with a thickness of 3 nm is formed in one step in the logic internal circuit region. In short, each of the first and second gate insulating films 102A and 115 is formed in one step, so that the reliability thereof is improved compared with a conventional gate insulating film formed in two steps.

Moreover, the second gate electrode 117 formed in the logic internal circuit region and therefore required of high performance can be formed of the second metal film 114 having a low resistance value and less likely to have a depletion layer formed at the interface between itself and the gate insulating film.

On the other hand, the first gate electrode 103A formed in the logic peripheral circuit region and therefore not required of high performance can be formed simultaneously with the resistor 103C which requires a certain value of resistance in a single step. This allows the resistor 103C to be formed without increasing the number of steps.

Although the mask pattern 110 has covered the entire logic peripheral circuit region in the first embodiment, it is sufficient for the mask pattern 110 to cover at least the first gate electrode 102A.

Although the second gate insulating film 115 has been formed of the second silicon oxide film 112, a silicon oxynitride film may also be used instead.

Although the second gate electrode 117 has been formed of the second metal film 114 made of tungsten, another metal film composed of aluminum, copper, molybdenum, tungsten silicide, or a metal compound of any one of the foregoing metals may also be used instead.

EMBODIMENT 2

As a method of manufacturing a semiconductor device according to a second embodiment of the present invention, there will be described a method of forming a first MOSFET in a memory circuit region and a second MOSFET in a logic circuit region with reference to FIGS. 4(a) and 4(b), 5(a) and 5(b), and 6(a) and 6(b).

First, as shown in FIG. 4(a), isolation regions 201 are formed in a surface region of a semiconductor substrate 200 made of silicon. Then, a first silicon oxide film having a thickness of, e.g., 7 nm, a polysilicon film doped with an impurity and having a thickness on the order of, e.g., 50 nm, and a first metal film made of a compound of a refractory metal such as tungsten silicide are formed successively over the entire surface of the semiconductor substrate 200. Subsequently, the first metal film, the polysilicon film, and the first silicon oxide film are patterned successively, thereby forming a first gate insulating film 202A composed of the first silicon oxide film and a first gate electrode composed of a multilayer structure consisting of the polysilicon film 203A and the first metal film 204A in the memory circuit region, while forming a dummy gate insulating film 202B composed of the first silicon oxide film and a dummy gate electrode composed of a multilayer structure consisting of the polysilicon film 203B and the first metal film 204B in the logic circuit region.

Next, an impurity is implanted by using the first gate electrode (203A, 204A) and the dummy gate electrode (203B, 204B) as a mask to form lightly doped regions 205. Then, sidewalls 206 are formed on each of the first gate electrode (203A, 204A) and the dummy gate electrode (203B, 204B). Subsequently, an impurity is implanted by using the first gate electrode (203A, 204A), the dummy gate electrode (203B, 204B), and the sidewalls 206 as a mask to form heavily doped regions 207 which are to serve as a source and a drain. After that, an interlayer insulating film 208 composed of a silicon oxide film with a thickness of, e.g., 500 nm is formed by, e.g., CVD over the entire surface of the semiconductor substrate 200.

Next, as shown in FIG. 4(b), the interlayer insulating film 208 is planarized by, e.g., CMP to expose the respective top surfaces of the first gate electrode (203A, 204A) and the dummy gate electrode (203B, 204B). Then, a silicon nitride film 209 with a thickness of, e.g., 50 nm is deposited over the entire surface of the semiconductor substrate 200.

Figure 5A:
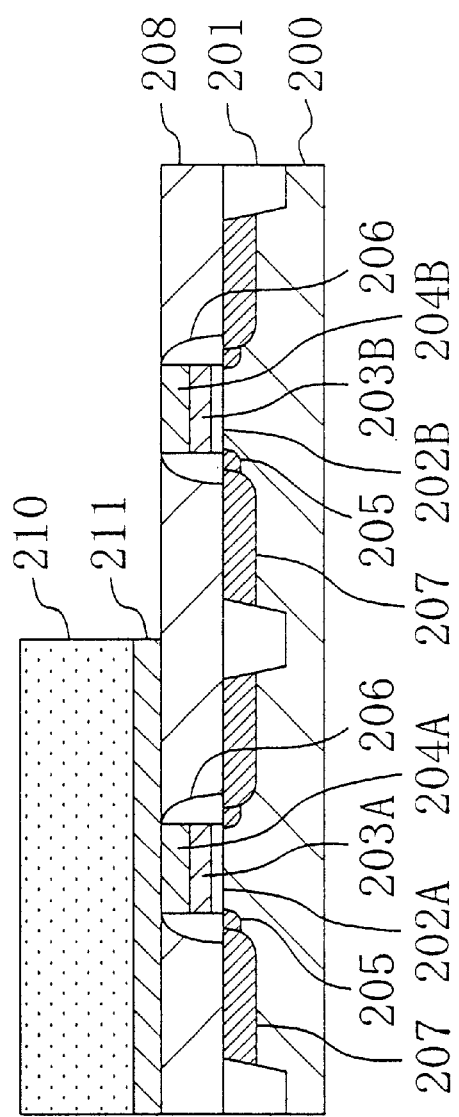
FIGS. 5(a) and 5(b) are cross-sectional views illustrating the individual process steps of the method of manufacturing a semiconductor device according to the second embodiment.

Next, as shown in FIG. 5(a), a resist pattern 210 covering the memory cell region is formed on the silicon nitride film 209. Subsequently, etching is performed with respect to the silicon nitride film 209 masked with the resist pattern 210 to form a mask pattern 211 composed of the silicon nitride film 209.

Figure 5B:
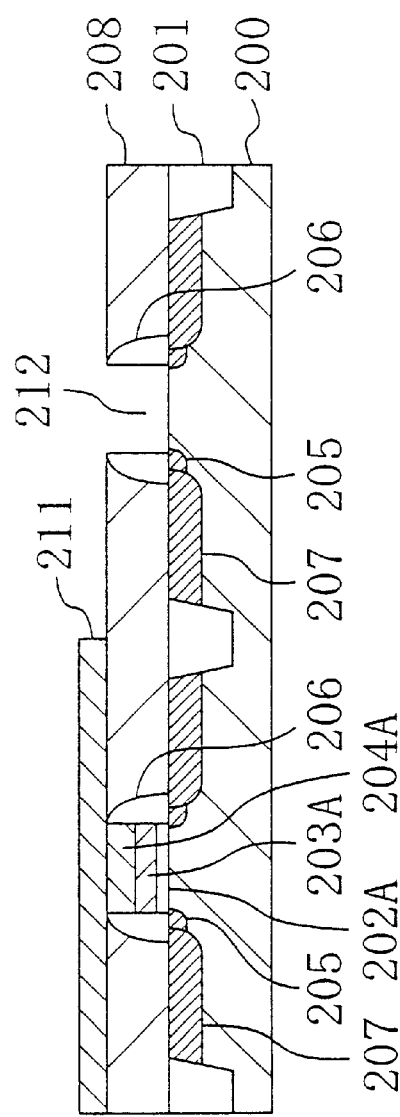

Next, as shown in FIG. 5(b), after removing the resist pattern 210, the first metal film 204B is removed by wet etching using an etchant solution composed of a solution mixture of sulfuric acid and aqueous hydrogen peroxide. Thereafter, the polysilicon film 203B is removed by wet etching using an etchant solution composed of an alkaline solution such as KOH. After that, the dummy gate insulating film 202B is removed by wet etching using an etchant solution composed of a HF solution, whereby a depressed portion 212 is formed internally of the sidewalls 206 in the logic circuit region.

Figures 6A, 6B:
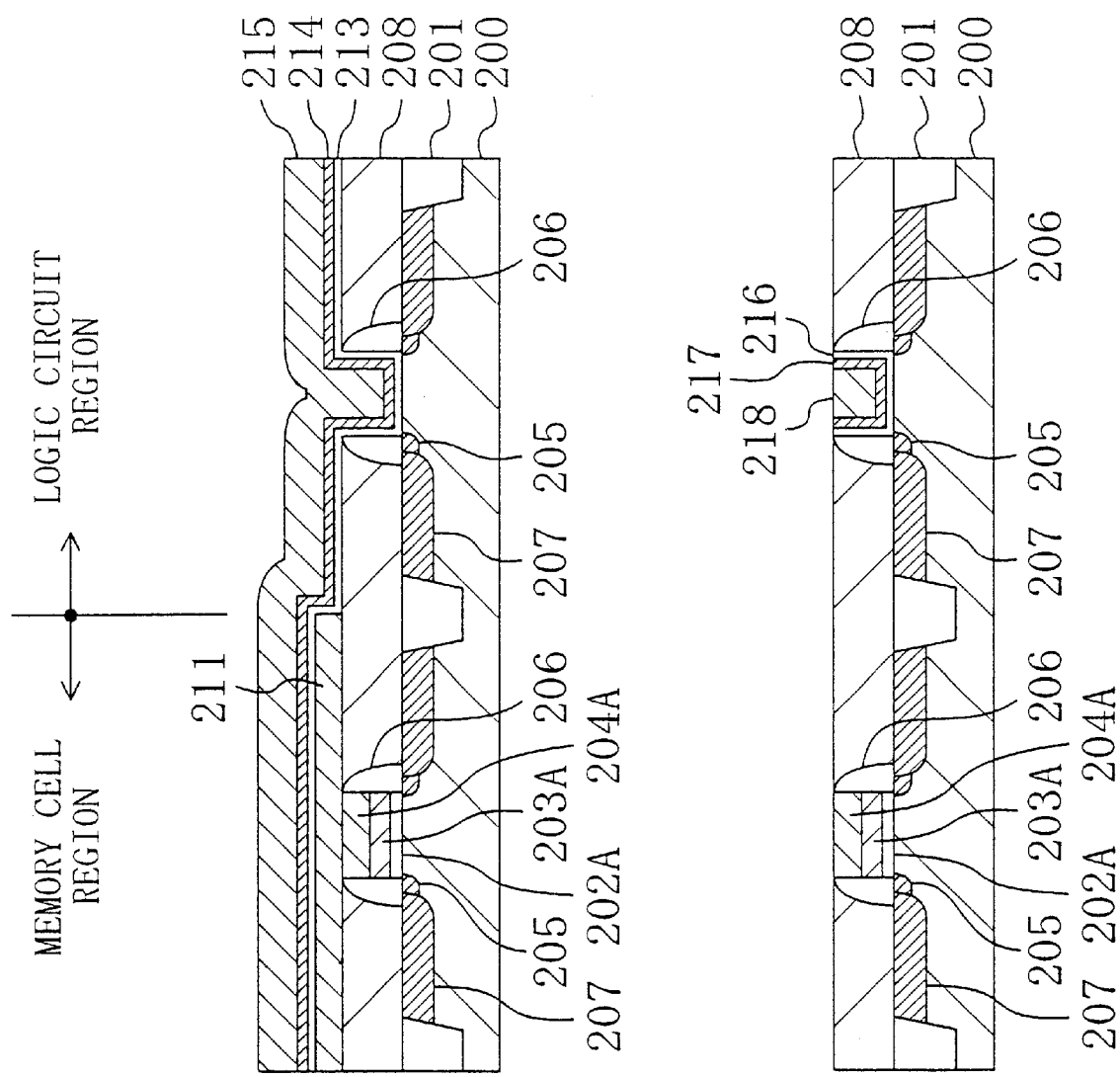
FIGS. 6(a) and 6(b) are cross-sectional views illustrating the individual process steps of the method of manufacturing a semiconductor device according to the second embodiment.

Next, as shown in FIG. 6(a), a second silicon oxide film 213 with a thickness of, e.g., 3 nm is formed over the entire surface of the semiconductor substrate 200. Thereafter, a second metal film 214 composed of a compound of a refractory metal such as tungsten nitride and having a thickness of about 10 nm is deposited over the entire surface of the second silicon oxide film 213. Subsequently, a third metal film 215 composed of tungsten and having a thickness of about 120 nm is deposited by, e.g., CVD over the entire surface of the second metal film 214.

Next, as shown in FIG. 6(b), planarization is performed with respect to the third metal film 215, the second metal film 214, and the mask pattern 211 by, e.g., CMP till the top surface of the first gate electrode (203A, 204A) is exposed, thereby forming a second gate insulating film 216 composed of the second silicon oxide film 213, a barrier metal 217 composed of the second metal film 214, and a second gate electrode 218 composed of the third metal film 215 in the depressed portion 212 internal of the sidewalls 206 in the logic circuit region. Preferably, a slurry with little selectivity between the second and third metal films 214 and 215 and the mask pattern 211 composed of the silicon nitride film 209 is used in the planarization step.

According to the second embodiment, the first MOSFET having the first gate insulating film 202A composed of the first silicon oxide film with a thickness of 7 nm is formed in one step in the memory circuit region, while the second MOSFET having the second gate insulating film 216 composed of the second silicon oxide film 213 with a thickness of 3 nm is formed in one step in the logic circuit region. In short, each of the first and second gate insulating films 202A and 216 is formed in one step, so that the reliability thereof is improved compared with a conventional gate insulating film formed in two steps.

Moreover, the second gate electrode 218 formed in the logic circuit region and therefore required of high performance can be formed of the third metal film 218 having a low resistance value and less likely to have a depletion layer formed at the interface between itself and the gate insulating film.

On the other hand, the first gate electrode formed in the memory circuit region and therefore not required of high performance can be formed of the multilayer structure consisting of the polysilicon film 203A and the first metal film 204A.

Since the second MOSFET having the second gate insulating film 216 composed of the second silicon oxide film 213 with a relatively small thickness and the second gate electrode 218 composed of the third metal film 218 with a low resistance is provided in the logic circuit region, the second embodiment enables the formation of a merged DRAM/LOGIC LSI with high reliability.

Since the first MOSFET having the first gate electrode composed of the multilayer structure consisting of the polysilicon film 203A and the first metal film 204A is provided, the second embodiment can also reduce the resistance value of the gate electrode compared with the first embodiment.

EMBODIMENT 3

As a method of manufacturing a semiconductor device according to a third embodiment of the present invention, there will be described a method of forming a flash memory and a capacitor in a memory circuit and a MOSFET in a logic circuit with reference to FIGS. 7(a) and 7(b), 8(a) and 8(b), and 9(a) and 9(b).

First, as shown in FIG. 7(a), isolation regions 301 are formed in a surface region of a semiconductor substrate 300 made of silicon. Then, a first silicon oxide film having a thickness of, e.g., 7 nm and a polysilicon film doped with an impurity and having a thickness of, e.g., 120 nm are formed successively over the entire surface of the semiconductor substrate 300. Subsequently, the polysilicon film and the first silicon oxide film are patterned successively to form a first-layer gate insulating film 302A composed of the first silicon oxide film and a floating gate electrode 303A composed of the polysilicon film in the flash memory formation area of a memory cell region, to form a dummy gate insulating film 302B composed of the first silicon oxide film and a dummy gate electrode 303B composed of the polysilicon film in a logic circuit region, and to form a capacitor insulating film 302C composed of the first silicon oxide film and a capacitor lower electrode 303C composed of the polysilicon film in the capacitor formation area of the memory cell region.

Next, an impurity is implanted by using the floating gate electrode 303A and the dummy gate electrode 303B as a mask to form lightly doped regions 304. Then, sidewalls 305 are formed on each of the floating gate electrode 303A, the dummy gate electrode 303B, and the capacitor lower electrode 303C. Subsequently, an impurity is implanted by using the floating gate electrode 303A, the dummy gate electrode 303B, and the sidewalls 305 as a mask to form heavily doped regions 306 which are to serve as a source and a drain. After that, an interlayer insulating film 307 composed of a silicon oxide film with a thickness of, e.g., 400 nm is formed by, e.g., CVD over the entire surface of the semiconductor substrate 300.

Next, as shown in FIG. 7(b), the interlayer insulating film 307 is planarized by, e.g., CMP to expose the respective top surfaces of the floating gate electrode 303A, the dummy gate electrode 303B, and the capacitor lower electrode 303C. Then, a silicon nitride film 308 with a thickness of, e.g., 10 nm is deposited over the entire surface of the semiconductor substrate 300.

Next, as shown in FIG. 8(a), a resist pattern 309 covering the memory cell region is formed on the silicon nitride film 308. Subsequently, etching is performed with respect to the silicon nitride film 308 masked with the resist pattern 309 to form a mask pattern 310 composed of the silicon nitride film 308.

Next, as shown in FIG. 8(b), after removing the resist pattern 309, the dummy gate electrode 303B is removed by wet etching using an etchant solution composed of an alkaline solution such as KOH. Thereafter, the dummy gate insulating film 302B is removed by wet etching using an etchant solution composed of a HF solution, whereby the depressed portion 311 is formed internally of the sidewalls 305 in the logic circuit region. Preferably, an etchant solution which does not remove the mask pattern 310 is used in the wet etching step.

Figure 9A:
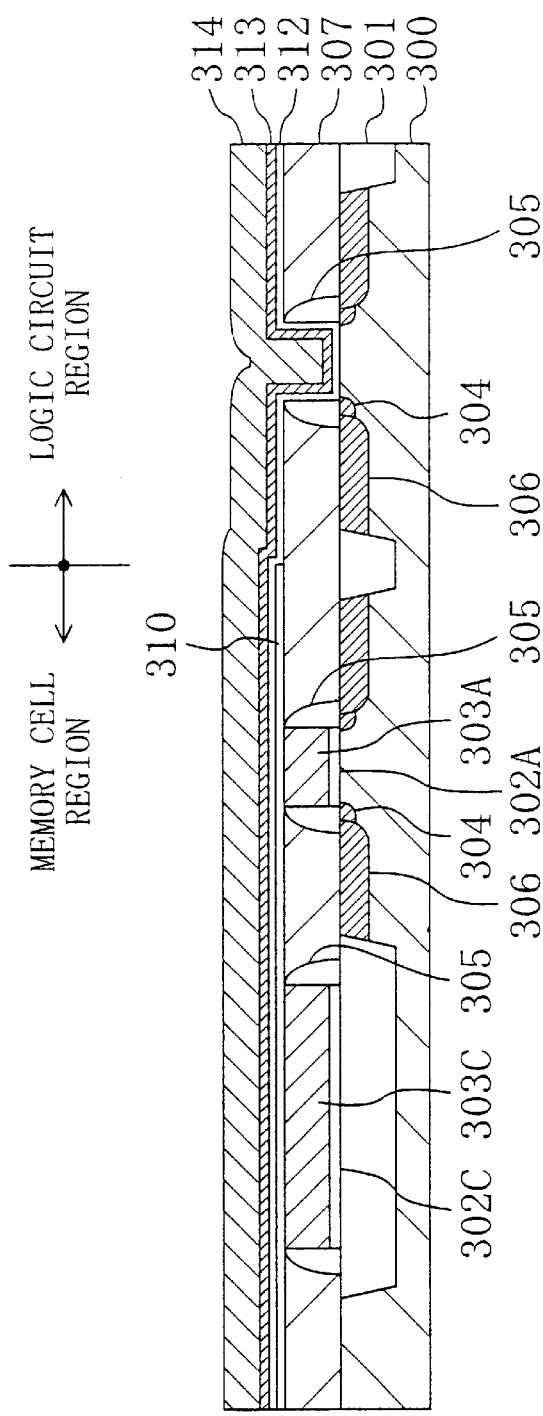
FIGS. 9(a) and 9(b) are cross-sectional views illustrating the individual process steps of the method of manufacturing a semiconductor device according to the third embodiment.

Next, as shown in FIG. 9(a), a second silicon oxide film 312 with a thickness of, e.g., 3 nm is formed over the entire surface of the semiconductor substrate 300. Then, a first metal film 313 composed of a compound of a refractory metal such as tungsten nitride and having a thickness of about 10 nm is deposited by, e.g., CVD over the entire surface of the second silicon oxide film 312. Subsequently, a second metal film 314 composed of, e.g., tungsten and having a thickness of about 120 nm is deposited by, e.g., CVD over the entire surface of the first metal film 313.

Figure 9B:
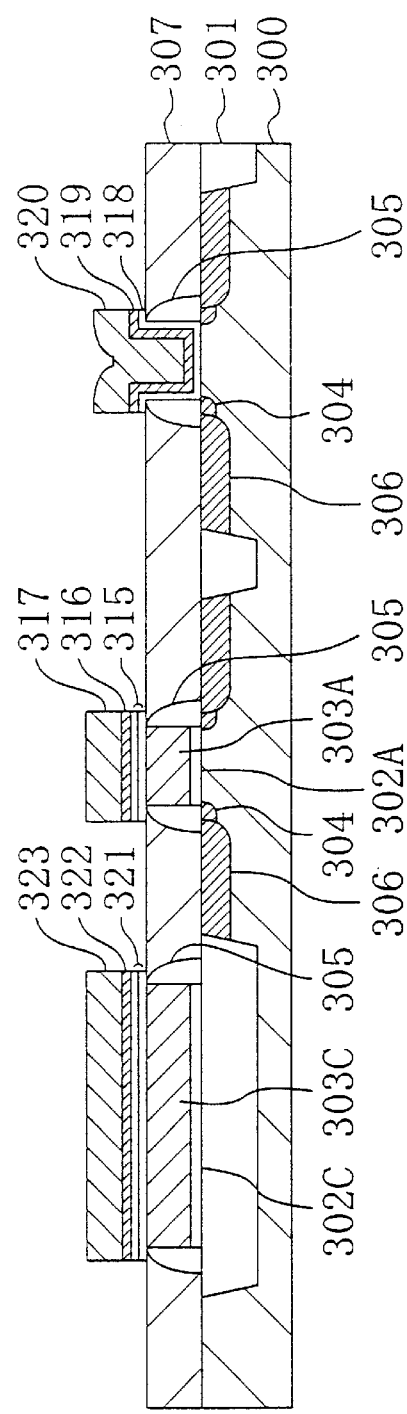

Next, as shown in FIG. 9(b), the second metal film 314, the first metal film 313, the second silicon oxide film 312, and the mask pattern 310 (silicon nitride film 308) are patterned into predetermined configurations to form a second-layer gate insulating film 315 composed of the silicon nitride film 308 and the second silicon oxide film 312, a first barrier metal 316 composed of the first metal film 313, and a control electrode 317 composed of the second metal film 314 in the flash memory formation area of the memory cell region, to form a gate insulating film 318 composed of the second silicon oxide film 312, a second barrier metal 319 composed of the first metal film 313, and a gate electrode 320 composed of the second metal film 314 in the logic circuit region, and to form a capacitor insulating film 321 composed of the silicon nitride film 308 and the second silicon oxide film 312, a third barrier metal 322 composed of the first metal film 313, and a capacitor upper electrode 323 composed of the second metal film 314 in the capacitor formation area of the memory cell region.

According to the third embodiment, the first-layer gate insulating film 320A of the flash memory composed of the first silicon oxide film with a thickness of 7 nm is formed in one step in the memory cell region, so that the reliability thereof is improved. Since the second-layer gate insulating film 315 is composed of a multilayer structure consisting of the silicon nitride film 308 and the second silicon oxide film 312, the reliability thereof and the reliability of the flash memory are improved.

Since the MOSFET having the gate insulating film 318 composed of the second silicon oxide film 312 with a thickness of 3 nm is formed in one step in the logic circuit region, the reliability thereof is improved compared with a conventional gate insulating film formed in two steps.

Moreover, the gate electrode 320 of the MOSFET formed in the logic circuit region and therefore required of high performance is formed of the second metal film 314 having a low resistance value and having no depletion layer at the interface between itself and the gate insulating film.

On the other hand, the capacitor insulating film 321 composing the capacitor is formed of the multilayer structure consisting of the silicon nitride film 308 and the second silicon oxide film 312, which ensures the reliability of the capacitor.

Furthermore, the capacitor can be formed in the memory cell region without increasing the number of process steps since the floating gate electrode 303A and the capacitor lower electrode 303C can be formed in one step, the second-layer gate insulating film 315 and the capacitor insulating film 321 can be formed in one step, and the control electrode 317 and the capacitor upper electrode 323 can be formed in one step.

What is claimed is:

1. A method of manufacturing a semiconductor device, the method comprising a first film forming step of successively forming, on a semiconductor substrate, a first insulating film having a relatively large thickness and a polysilicon film;

a first patterning step of patterning the polysilicon film and the first insulating film to form a first-layer gate insulating film of a flash memory and a dummy gate insulating film, each being composed of the first insulating film, and to form a floating gate electrode of the flash memory and a dummy gate electrode, each being composed of the polysilicon film;

a sidewall forming step of forming sidewalls on each of the floating gate electrode and the dummy gate electrode;

an insulating film removing step of depositing an interlayer insulating film over the entire surface of the semiconductor substrate, removing the portions of the interlayer insulating film overlying the floating gate electrode and the dummy gate electrode, and thereby exposing the floating gate electrode and the dummy gate electrode;

an etching step of forming, on the interlayer insulating film, a second insulating film covering the floating gate electrode and exposing the dummy gate electrode, performing etching by using the second insulating film to remove the dummy gate electrode and the dummy gate insulating film, and thereby forming a depressed portion internally of the sidewalls of the dummy gate electrode;

a second film forming step of successively forming, over the entire surface of the semiconductor substrate, a third insulating film having a relatively small thickness and a metal film such that the depressed portion is filled therewith; and a second patterning step of patterning the second insulating film, the third insulating film, and the metal film to form a second-layer gate insulating film of the flash memory composed of the second and third insulating films, a gate insulating film of a FET composed of the third insulating film, a control electrode of the flash memory composed of the metal film, and a gate electrode of the FET composed of the metal film.

2. The method of claim 1, wherein the etching step includes the step of removing the dummy gate electrode and the dummy gate insulating film by wet etching.

3. The method of claim 1, wherein the first patterning step includes the step of patterning the polysilicon film and the first insulating film to form a capacitor insulating film composed of the first insulating film and a capacitor lower electrode composed of the polysilicon film and the second patterning step includes the step of patterning the second insulating film, the third insulating film, and the metal film to form a capacitor insulating film composed of the second and third insulating films and a capacitor upper electrode composed of the metal film.

4. A method of manufacturing a semiconductor device, the method comprising:

a first film forming step of successively forming, on a semiconductor substrate, a first insulating film having a relatively large thickness and a multilayer structure being composed of a lower-layer polysilicon film and an upper-layer metal film of a refractory metal or a compound of a refractory metal and a patterning step of patterning the multilayer structure and the first insulating film to form a first gate insulating film, each being composed of the first insulating film, and to form a first gate electrode of the first FET and a dummy gate electrode, each being composed of the multilayer structure;

a sidewall forming step of forming sidewall on each of the first gate electrode and the dummy gate electrode;

an insulating film removing step of depositing an interlayer insulating film over the entire surface of the semiconductor substrate, removing the portion of the interlayer insulating film overlying the first gate electrode and the dummy gate electrode, and thereby exposing the first gate electrode and the dummy gate electrode;

an etching step of forming, on the interlayer insulating film, a mask pattern covering the first gate electrode and exposing the dummy gate electrode, performing etching by using the mark pattern to remove the dummy gate electrode and the dummy gate insulating film, and thereby forming a depressed portion internally portion internally of the sidewalls of the dummy gate electrode;

a second film forming step of successively forming, over the entire surface of the semiconductor substrate, a second insulating film having a relatively small thickness and a metal film such that the depressed portion is filled therewith; and a film removing step of removing the mark pattern and the portion of the second insulating film and the metal film located externally of the depressed portion and thereby forming a second gate insulating film and a second FET composed of the second insulating film and a second gate electrode of the second FET composed of the metal film.

* * * * *